(12) United States Patent
Brueck

(10) Patent No.: US 7,794,904 B2
(45) Date of Patent: Sep. 14, 2010

(54) METHOD AND APPARATUS FOR PRODUCING INTERFEROMETRIC LITHOGRAPHY PATTERNS WITH CIRCULAR SYMMETRY

(75) Inventor: Steven R. J. Brueck, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 678 days.

(21) Appl. No.: 11/739,551

(22) Filed: Apr. 24, 2007

(65) Prior Publication Data

US 2007/0249072 A1 Oct. 25, 2007

Related U.S. Application Data

(60) Provisional application No. 60/794,142, filed on Apr. 24, 2006.

(51) Int. Cl.
*G03C 5/00* (2006.01)
*G02B 5/30* (2006.01)
(52) U.S. Cl. .......................... 430/30; 359/489
(58) Field of Classification Search .............. 430/5, 430/30; 355/53, 67; 359/489
See application file for complete search history.

(56) References Cited

U.S. PATENT DOCUMENTS 6,243,348 B1 * 6/2001 Goodberlet ................. 369/101
2006/0146384 A1 * 7/2006 Schultz et al. ................. 359/9

* cited by examiner

*Primary Examiner*—Stephen Rosasco
(74) *Attorney, Agent, or Firm*—MH2 Technology Law Group LLP

(57) ABSTRACT

Exemplary embodiments provide optical systems and methods for producing interferometric lithography (IL) patterns with circular symmetry for applications such as memory devices including CD ROMs, DVDs, magnetic hard disk storage, and the like. Specifically, one or more axicon optics can be configured in the optical systems for IL patterning processes to form a uniform set of rings with constant increment in all directions in a developed photoresist. In an exemplary embodiment, the optical system can transform a first portion of a plane wave into a radial symmetric wave with a constant angle of incidence onto a photoresist plane of a wafer. This radial symmetric wave can then interfere with a second portion of the plane wave incident but with a different angle of incidence to produce a periodic spatially-varying intensity pattern with circular symmetry.

22 Claims, 5 Drawing Sheets

METHOD AND APPARATUS FOR PRODUCING INTERFEROMETRIC LITHOGRAPHY PATTERNS WITH CIRCULAR SYMMETRY

RELATED APPLICATIONS

This application claims priority from U.S. Provisional Patent Application Ser. No. 60/794,142, filed Apr. 24, 2006, which is hereby incorporated by reference in its entirety.

DESCRIPTION OF THE INVENTION

1. Field of the Invention

This invention relates generally to microelectronic circuits and, more particularly, to methods and apparatus for producing semiconductor patterns with circular symmetry.

2. Background of the Invention

Interferometric lithography (IL) is emerging as a powerful technique for the fabrication of large areas of nanostructures. For example, an optical geometry having two-plane-wave interference is commonly used to produce one-dimensional (i.e., 1D) nanopatterns (e.g., gratings). 2D patterns are obtained by repeating the exposure step with the wafer rotated 90° (e.g., square pattern) or 60° (e.g., hexagonal pattern). More complex patterns are obtained by using other angular rotations, variations in the pitch for a single exposure, and/or additional exposures.

Nanopatterns having an overall circular symmetry are desired in many applications such as modern memory devices. In this case, an optical system is required to produce a wave with a circularly symmetric and radially constant angle of incidence onto a photosensitive surface. For small periods, this angle of incidence has to be suitably large, requiring a non-paraxial optical system (e.g. an optical system for which the sine of the angle of incidence is substantially different than the angle of incidence). Interference between two such circularly symmetric radially invariant beams produces the desired circularly symmetric pattern. Conventional optical systems (such as lens machined with spherical radii of curvature), however, are not suitable for production of these desired waves.

Thus, there is a need to overcome these and other problems of the prior art and to provide a method and an apparatus for producing IL patterns with circular symmetry.

SUMMARY OF THE INVENTION

According to various embodiments, the present teachings include an optical system. The optical system can include a plane wave incident at normal incidence on a disk substrate. In the center of the disk substrate, an axicon optic can be configured to transform a first portion of the plane wave into a radial symmetric wave with a constant angle of incidence onto a photoresist plane. The transformed radial symmetric wave can be interfered with a second portion of the plane wave to produce a periodic spatially-varying intensity pattern with circular symmetry in the photoresist plane.

According to various embodiments, the present teachings also include a method of forming an interference pattern. In the method, an axicon optic can be configured in a center of a disk substrate with a plane wave incident at normal incidence on both the axicon optic and the disk substrate. The axicon optic can be used to transform a first portion of the plane wave into a radial symmetric wave with a constant angle of incidence onto a photoresist plane. An interference pattern with circular symmetry can then be produced in the photoresist plane by interfering the radial symmetric wave with a second portion of the plane wave.

According to various embodiments, the present teachings further include an optical system. The optical system can include a plane wave incident at normal incidence on a disk and a first axicon configured in a center of the disk to transform a first portion of the plane wave incident into a radial symmetric wave with a constant angle of incidence onto a photoresist layer. The optical system can also include a plurality of second axicons symmetrically configured in the disk and substantially centered by the first axicon to provide a plurality of beam paths for apodizing optical intensity in radial direction. The apodized radial symmetric wave can then be interfered with a second portion of the plane wave incident to produce an interference pattern with circular symmetry in the photoresist layer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
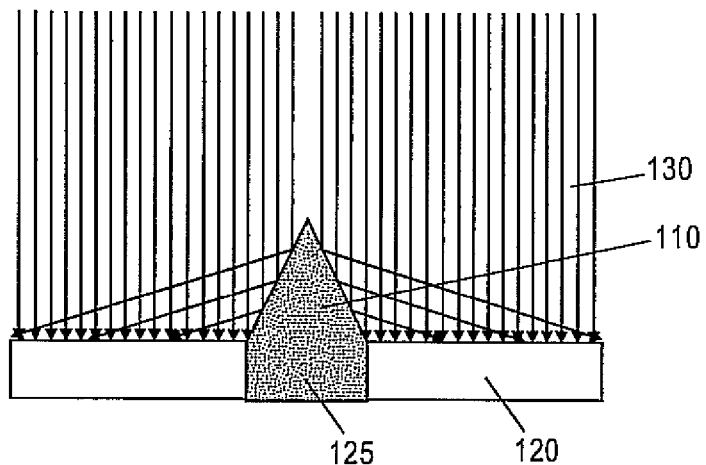
FIG. 1 depicts an exemplary optical system including a single axicon optic and a uniform plane wave at normal incidence in accordance with the present teachings.

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Exemplary embodiments provide optical systems and methods for producing interferometric lithography (IL) patterns with circular symmetry for applications such as memory devices, for example, CD ROMs, DVDs, magnetic hard disk storage, and the like. Specifically, one or more axicon optics can be used in an optical system for the IL patterning process to form a uniform set of rings with constant increment in all directions in a photosensitive material such as a photoresist. In an exemplary embodiment, the optical system can transform a first portion of a plane wave incident into a radial symmetric wave with a constant angle of incidence onto a photoresist plane of a wafer. This radial symmetric wave can then interfere with a second portion of the plane wave but with a different angle of incidence to produce a periodic spatially-varying intensity pattern with circular symmetry.

As used herein, the term "Interferometric lithography" ("IL") (also referred to as "holographic lithography" in the art) refers to a lithographic process that involves interference patterns of two (or more) mutually coherent light waves. Specifically, IL is the use of a small number of coherent optical beams incident from different directions on a two-dimensional (2-D) thin photosensitive film or three-dimensional (3-D) thick photosensitive layer to produce an interference pattern whose intensity distribution is recorded in the photosensitive layer and is later transferred (e.g., developed) by thermal and/or chemical processes. The angles between the light propagation vectors of the two or more waves can be sufficiently large to produce an interference pattern that has a high spatial frequency. Suitable optical source wavelengths for the IL process can include, but are not limited to: I-line (364 nm Ar-ion laser and 355 nm tripled YAG laser); 244 nm (doubled Ar-ion); and/or 213/193 (fifth harmonic YAG/ArF laser). In various embodiments, various mediums (e.g., air, and water) can be used for the IL process to fabricate nanostructures or patterns of nanostructures. In some embodiments, the photosensitive (e.g., photoresist) film/layer can be formed on a semiconductor substrate such as a wafer. In other embodiments, additional thin-film layers can be included over the photosensitive layer of the semiconductor wafer.

Generally, the interference between a plane wave and a spherical wave can provide an interference pattern, for example, as known as Newton's rings. The Newton's rings have been found in conventional IL patterns whenever a dust particle on an optical component scatters light into a spherical wave that interferes with the plane wave passing around the dust particle. These rings were first observed in the interference between waves generated by a convex spherical surface of a lens and a plane glass surface in contact.

For example, if assuming unity amplitude and assuming normal incidence onto the wafer, the plane wave with its phase front coincident with the z=0 plane of the coordinate system can be given by:

$$E_p(x,y,z) = \hat{e}_p e^{ikz} \tag{1}$$

Where k is the wavevector in the medium; and $\hat{e}_p$ is a unity amplitude polarization vector describing the polarization of the input beam. The wavevector k can be further determined by:

$$k = 2n\pi/\lambda$$

where n is the refractive index of the medium in contact with the photoresist layer which can be atop a substrate such as a wafer, and $\lambda$ is the beam source wavelength, for example, about 193 nm for an ArF excimer laser source.

In various embodiments, a circular polarization can be involved to provide the disclosed circular symmetry. In a circular polarization, the spherical wave can be similarly described in a form of:

$$E_s(r, \theta, \varphi) = A\hat{e}_s(\theta, \varphi) \frac{f(\theta, \varphi)}{\sqrt{4\pi} R} e^{ikR} \tag{2}$$

Where R is the distance from the origin of the spherical wave (i.e., x=y=0; and z=z$_0$) and R is determined by R= $\sqrt{x^2+y^2+(z-z_0)^2}$; $\rho$ is the radial distance in the plane of the exemplary wafer substrate and is determined by $\rho=\sqrt{x^2+y^2}$, and thus R=$\sqrt{\rho^2+(z-z_0)^2}$; A is the amplitude of the spherical wave relative to the plane wave; f($\theta$, $\phi$) is a real function that describes the directionality of the spherical wave, and $\hat{e}_s(\theta,\phi)$ is the unit vector that varies across the surface depending on the specifics of the polarization of the incident wave. For example, if f($\theta$, $\phi$)=1, that means the spherical wave is a spherically expanding wave in all directions. In another example, a strongly forward peaked f($\theta$,$\phi$) can be a Gaussian beam well beyond the Rayleigh range.

If, for example, the reflection at the interface of the immersion fluid and the photoresist, as well as the related thin film effects are neglected, the optical intensity in the photoresist plane of the exemplary wafer (i.e., z=0) can be given and further processed by:

$$I(\rho, z, \theta) = \left| \hat{e}_p e^{+ikz} + \hat{e}_s(\theta, \varphi) A \frac{f(\theta, \varphi)}{\sqrt{4\pi} R} e^{ikR} \right|^2 \quad (3)$$

$$= 1 + \frac{|f(\theta, \varphi)|^2}{4\pi R^2} + 2\hat{e}_p \cdot \hat{e}_s(\theta, \varphi) \frac{f(\theta, \varphi)}{\sqrt{4\pi} R} \cos(-kR)$$

$$= 1 + \frac{|f(\theta, \varphi)|^2}{4\pi R^2} + 2\hat{e}_p \cdot \hat{e}_s(\theta, \varphi) \frac{f(\theta, \varphi)}{\sqrt{4\pi} R} \cos\left(-k\sqrt{\rho^2 + z_0^2}\right)$$

For equation (3), in the limit of $z_0 \gg \rho$, the argument inside the cosine can be approximated in a simple Taylor series as cos $$\left\{-kz_0\left[1 + \frac{1}{2}(\rho/z_0)^2\right]\right\}.$$

This "cos" term can describe a set of concentric circles in $\rho$ with an increment in the radius for each ring as a result of the $\rho^2$ in the expression. This can be the result presented in many optics texts.

In the opposite extreme, when $\rho \gg z_0$, the approximation can be given as $$\cos\left\{-k\rho\left[1 + \frac{1}{2}(z_0/\rho)^2\right]\right\}.$$

This can result in a set of concentric rings of constant increment given by $k\rho = 2\pi m$ and $\Delta\rho = \lambda/n$, wherein m is an integer indexing the radius of each ring.

In various embodiments, one or more axicon optics can be used for the optical system of the disclosed IL processes. As used herein, the term "axicon" refers to a specialized type of optical element that has a conical surface. The "axicon" can be a conical prism. The "axicon" can image a point beam source into a line along the optic axis, or transform a collimated laser beam into a ring. For example, an axicon can be used to turn a Gaussian beam into an approximation to a Bessel beam, with greatly reduced diffraction.

FIG. 1 depicts an exemplary optical system 100 that includes one single axicon optic and a uniform plane wave at normal incidence in accordance with the present teachings. As shown in FIG. 1, the optical system 100 can include an axicon optic 110 configured in the center of a disk substrate 120. A uniform plane wave 130 can be introduced at normal incidence on the disk substrate 120. In an exemplary embodiment, the axicon optic 110 can be a reflective lens. In various embodiments, the geometry shown in FIG. 1 can provide an equi-spaced concentric circular pattern.

Figure 2:
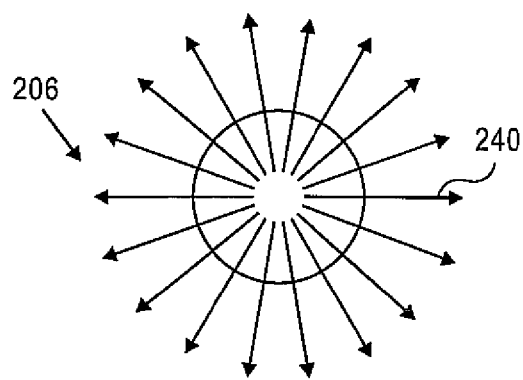
FIG. 2 is a schematic illustrating the functioning of the system shown in FIG. 1 in accordance with the present teachings.
Figure 2:
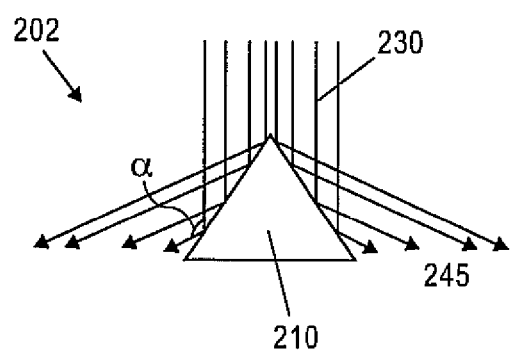

FIG. 2 is a schematic illustrating the functioning of the optical system shown in FIG. 1 in accordance with the present teachings. Specifically, FIG. 2 depicts a side view 202 and a top view 206 of an axicon optic 210 having a plane wave 230 at normal incidence. As shown, the axicon optic 210 can be a reflective axicon and convert an incident plane wave 230 into a radially symmetric wave 240. This radially symmetric wave 240 can be used for radial interference to write desired circular tracks. In this manner, an apodized wave with its transverse center of symmetry (see 240 in the top view 206) along the apex of a cone (see the axicon 210) of revolution with an angle (i.e., 180°-2α) of, for example, less than about 90°. For all polar angles around the exemplary photoresist plane (not shown), the light can be reflected in the same azimuthal direction 245 as indicated in the diagram of the side view 202. As a result, this optical system can transform a plane wave 230 into a radial symmetric wave 240 with a constant angle of incidence 245 onto the photoresist plane (not shown). In various embodiments, if the incident beam is larger in transverse extent than the cone section, there can also be a normal incident beam to interfere with the radial wave to provide the varying intensity interference pattern, provided that the path length differences are within the coherence length of the source. In various embodiment, the axicon optic 210 as well as the axicon optic 110 in FIG. 1 can be either reflective (mirrored) or refractive.

Referring back to FIG. 1, the disk substrate 120 of the axicon configuration in the optical system 100 can be a general hard disk substrate, for example, a 2.5" diameter disk. In an exemplary embodiment, the disk substrate 120 can have an unpatterned space at the hub 125 (e.g., having the axicon 110 on top) of the disk, for example, the hub 125 can have a diameter of about 0.5" or less, which can restrict the diameter of the axicon optic 110. Based on the dimensions of the disk substrate 120, the period and the overall transverse dimensions of the resulting IL patterns can be evaluated as a function of the opening angle (α) (see FIG. 2) of the axicon optic 110 or 210: For example, when opening angles (i.e., α) are in a range from about 45° to about 50° and with a 193-nm laser source, the pattern pitch can be about 200 nm ($\geq\lambda$) and the ½ extent of the pattern can be larger than the radius of the disk substrate 120.

Figure 3A:
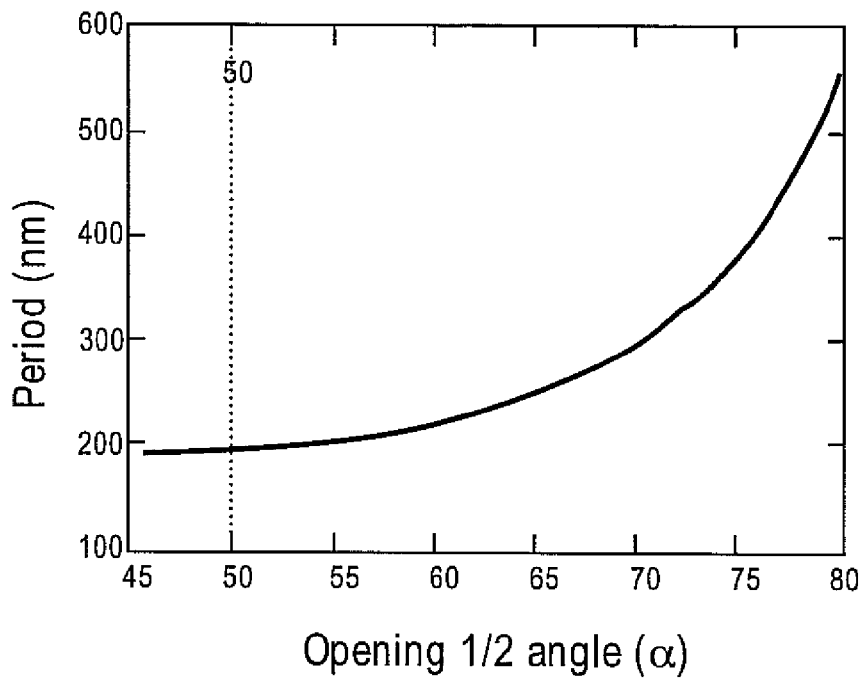
FIGS. 3A-3B depict the effect of the ½ opening angle ($\alpha$) of an axicon on IL patterns in accordance with the present teachings.
Figure 3B:
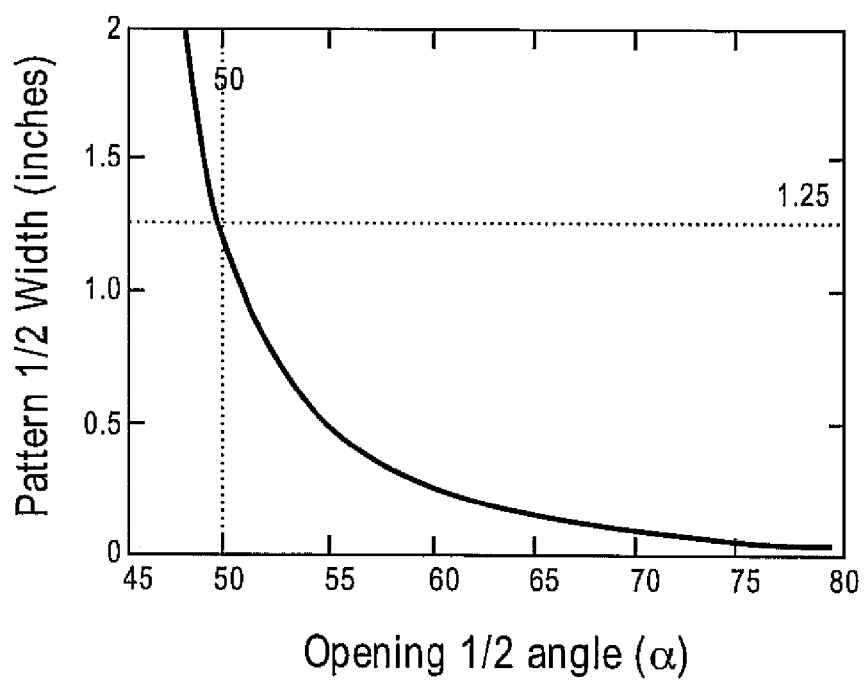

FIGS. 3A-3B depict the effect of the opening angle (α) of an axicon on the IL patterns in accordance with the present teachings. In particular FIG. 3A depicts the pattern period as a function of the opening angle (α) of an axicon, for example, the axicon 110 and/or 210 shown in FIGS. 1-2. When the opening angle (α) of an axicon is increased, the resulting pattern period can be decreased. FIG. 3B depicts the lateral extent of the pattern as a function of the opening angle (α). As shown, when the opening angle (α) of an axicon is increased, the lateral extent of the resulting pattern is decreased. In this manner, by adjusting the opening angle (α) of the axicon, the pattern period and the lateral extent of the IL pattern can be controlled.

In various embodiments, a circular polarization can be used for the disclosed optical system. In general, there can be variations of polarizations (and contrasts) around the resulting circular patterns. The polarization methods can include, for example, TE (Transverse Electric) polarizations, TM (Transverse Magnetic) polarizations and circular polarizations. Various polarization effects can be considered including, for example, polarization dependence of the electric field transmission into the photoresist; impact of varying polarizations on the interference pattern and variation in the polarization induced by the beam-forming system.

The polarization dependence of the electric field transmission is a function of the refractive index (n) of the medium in contact with the photoresist layer and the angle of incidence. For example, for a water immersion medium at 193 nm, the refractive index n can be about 1.44. When the wafer with photoresist device is coupled into a higher index medium, the usual Fresnel equations can be used. The Fresnel equations can be applied to the decomposition of an incident beam into orthogonal linear polarizations.

Figure 4:
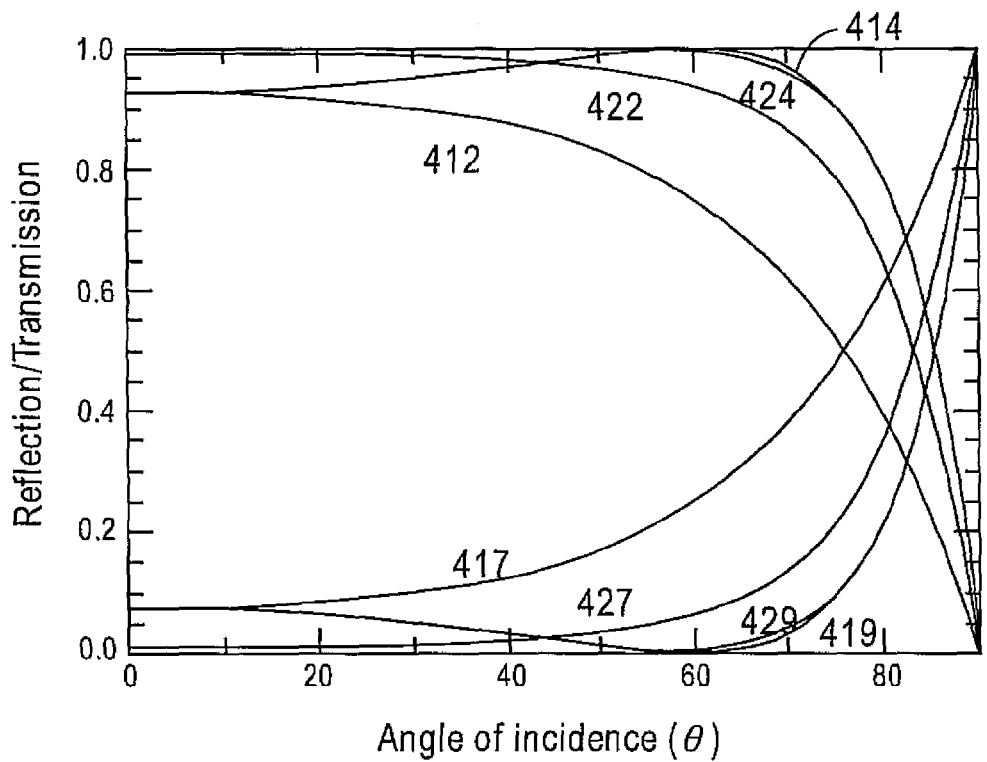
FIG. 4 depicts a Fresnel transmission and a Fresnel reflectivity on propagation from a low index medium into a high index medium as a function of the angle of incidence for both TE and TM polarizations in accordance with the present teachings.

For example, FIG. 4 depicts a Fresnel transmission and a Fresnel reflectivity on propagation from a low index medium into a high index medium as a function of the angle of incidence for both TE and TM polarizations in accordance with the present teachings. Specifically, the electric field transmission can be performed into the photoresist having an exemplary refractive index n of about 1.73 from a lower index medium. The lower index medium can be, for example, air having $n_{low}=1$ (air) or water having $n_{low}=1.44$ (water) at 193 nm. As shown, FIG. 4 can include a curve 412 for Fresnel transmission on propagation from a low index medium air ($n_{low}=1$) into a high index medium ($n_{high}=1.73$) as a function of the angle of incidence for TE polarization, a curve 414 for Fresnel transmission for TM polarization, a curve 417 for Fresnel reflectivity for TE polarization, and a curve 419 for Fresnel reflectivity for TM polarization. In addition, FIG. 4 can include a curve 422 for Fresnel transmission on propagation from a second low index medium water ($n_{low}=1.44$) into a high index medium ($n_{high}=1.73$) as a function of the angle of incidence for TE polarization, a curve 424 for Fresnel transmission for TM polarization, a curve 427 for Fresnel reflectivity for TE polarization, and a curve 429 for Fresnel reflectivity for TM polarization. As indicated in FIG. 4, when the angle of incidence is close to grazing or (θ~90), the reflectivity on propagation from the mediums with lower indices (e.g., $n_{low}=1$ or 1.44) into a high index medium (e.g., $n_{high}=1.73$) for both TE and TM polarizations (i.e., the curves 417, 419, 427, and 429) can tend to be unity, while the transmission for both TE and TM polarizations (i.e., the curves 412, 414, 422, and 424) can tend to be zero. That is, there can be no transmission when the angle of incidence approaches to grazing or 90°.

Figure 5:
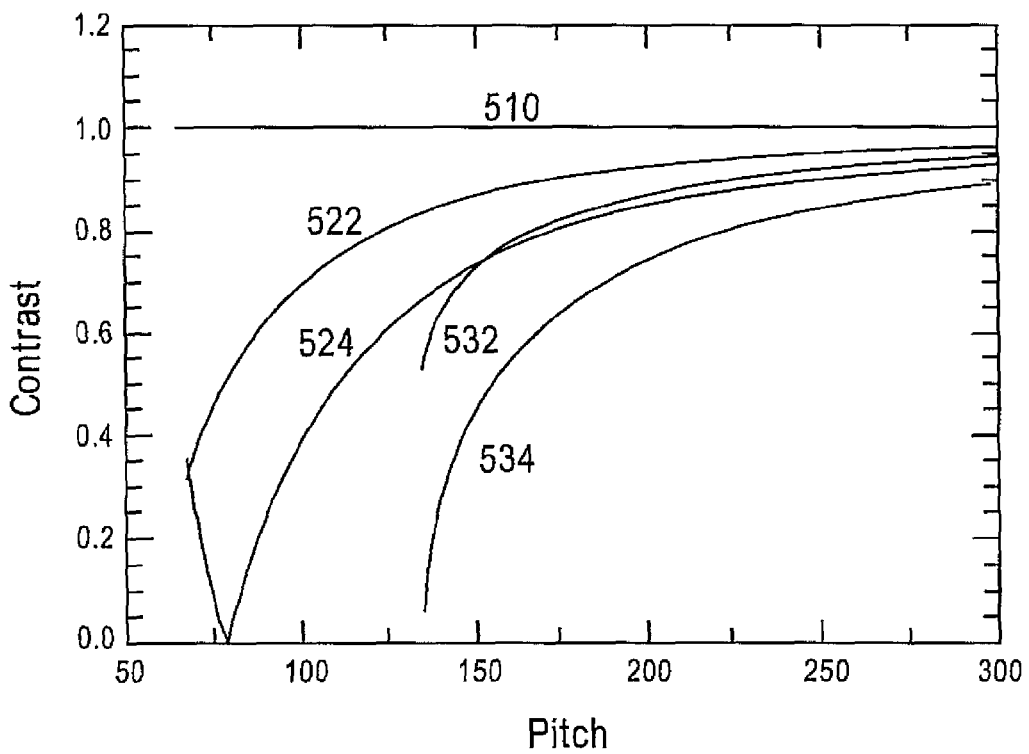
FIG. 5 depicts interference intensity for various polarizations as a function of the angle of the tilted beam in accordance with the present teachings.

FIG. 5 depicts the interference intensity for various polarizations including TE, TM components and circularly polarized beams as a function of the angle of the tilted beam (and thus the printed period of the circles) in accordance with the present teachings. Specifically, FIG. 5 shows polarization contrast (i.e., $[(I_{max}-I_{min})/(I_{max}+I_{min})]$) of different polarizations for symmetric interference (i.e., both beams tilted at θ) and asymmetric interference (i.e., only one beam tiled and the other at normal incidence). In various embodiments, contrast can influence both the line/space ratio of the developed pattern and the line-edge roughness. As shown, FIG. 5 can include a curve 510 for the TE polarization, which indicates that the TE polarization can maintain a contrast of about 1.0. FIG. 5 can also include a curve 522 and a curve 532 of circular polarization for symmetric interference (i.e., symmetric tilted) and asymmetric interference (i.e., single tilted beams), respectively. FIG. 5 can further include a curve 524 and a curve 534 of TM polarization for symmetric interference (i.e., symmetric tilted) and asymmetric interference (i.e., single tilted beam), respectively. As indicated by the curves 532 and 534, the limiting pitch λ/n for the asymmetric interference (i.e., single tilted beam) can be about 134 nm at an exemplary wavelength of 193 nm and in a water immersion (n=1.44). The minimum pitch λ/n can be about 67 nm for a symmetric configuration as indicated by curves 522 and 524 in FIG. 5. Comparing these minimum pitches (e.g., about 134 nm vs. about 67 nm), a 2× finer pitch can be available with a symmetric beam pattern (e.g., one beam tilted to grazing from the left and the other from the right). In addition, the contrast for TE polarization can be unity (see the curve 510), while the contrast for TM polarization (see the curves 524 and 534) can decrease as a result of the interference between the x- and z-directed beams, which can be out of phase with each other. Furthermore, the contrast for circular polarization (see the curves 522 and 532) can be just the average of the TE (see the curve 510) and TM results (see the curves 524 and 534).

As the result of FIG. 5, the contrast of the interference pattern can be different for TE polarization and TM polarization, which can become an issue as the pattern period is reduced to the limiting value of λ/2n (where λ is the source wavelength (e.g., 193 nm for an ArF excimer laser source) and n is the refractive index of the medium). This limiting value λ/2n can be the smallest pitch available in a single exposure. For example, referring back to FIG. 2, for a linearly polarized beam (for definiteness polarized out of the plane of figure), the two interfering beams can be TE polarized in the plane of the figure and TM polarized in the orthogonal directions (¼ of the way around the circles or out of the plane of the figure). In addition, there can be polarization differences for TE and TM in reflection, which can also need compensation. Therefore, a circular polarization (see the curves 522 and 524 in FIG. 5) can be used and the overall reduction in contrast can be acceptable as compared with TE polarization.

In various embodiments, two separate beam paths can be used for the incident beam to properly preshape (apodize) the incident intensity, in order to obtain uniform beam intensity in the radial direction. This is because there can be variations of beam intensity with radial position, for example, for the optical system 100 shown in FIG. 1. For example, the normally incident beam (e.g., the plane wave 130) directly onto the disk (e.g., the disk substrate 120) can have a constant power density, but the intensity of the part of the beam reflected from the axicon (e.g., axicon optic 110) can vary significantly with radial position as a result of the linear to polar conversion and the p dependence of the perimeter of each circle. As indicated in the equations (2) and (3), the radial variations (i.e., the factor of $1/(\sqrt{4\pi}R)$) in the expression for the spherical wave can be compensated in the f(θ,φ) dependence by, for example, adjusting the beam transmission to produce a shaped beam with the correct apodization (i.e., continuous variation of intensity with radial position) to compensate for the differential expansions (i.e., the "cos" term in equation (3)) of the beam and thus to compensate power densities at the photoresist as a result of the different optical paths. This can also allow matching the beam path lengths between the two optical paths to ensure the maximum contrast in the exposure pattern. In various embodiments, the overall exposure size can be consistent with the longitudinal coherence length of the laser source.

It is also noted that the interference fringes can be tilted in the geometry of the optical system 100 shown in FIG. 1 that has an asymmetric configuration. For example, the tilted interference fringes can have one beam at normal incidence and a second beam at a steep angle (near 90°), which can cause an issue for pattern transfer and photoresist collapse (due to surface tension during the drying process). Thus, a more symmetric geometry for the optical system can be used in accordance with the present teachings.

Figure 6:
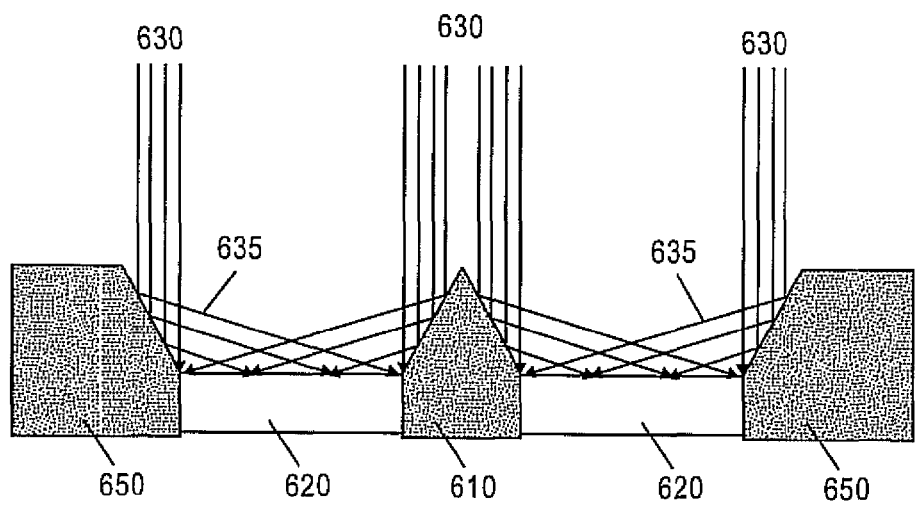
FIG. 6 depicts an exemplary illumination system having two axicon geometries for symmetric illumination of circular interference fringes in accordance with the present teachings.
Figure 7:
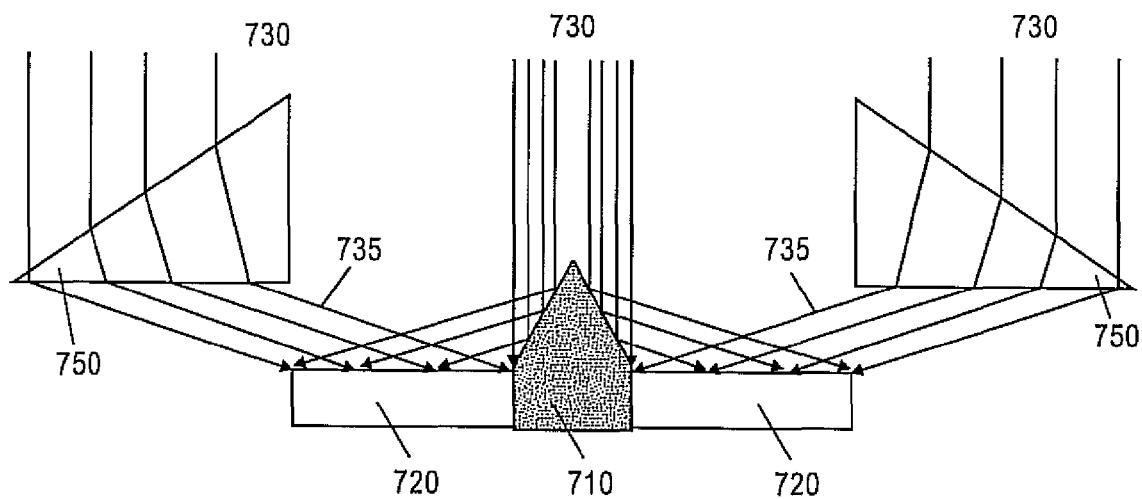
FIG. 7 depicts another exemplary illumination system having two axicon geometries for symmetric illumination of circular interference fringes in accordance with the present teachings.

FIGS. 6-7 depict a more symmetric geometry with both an inner axicon and an outer axicon along with two beam paths and two appropriate apodizations to match the beam intensities everywhere on the pattern. In addition to the symmetry advantages, these dual axicon geometries shown in FIGS. 6-7 can allow a factor of two smaller periods (i.e., limiting pitch) to λ/2n, as compared to the λ/n available in the geometry shown in FIG. 1.

FIG. 6 depicts an exemplary illumination system 600 having two axicon geometries for symmetric illumination of circular interference fringes in accordance with the present teachings. The illumination system 600 can include an inner axicon 610, a disk substrate 620 and outer reflective axicons 650. The inner axicon 610 can be formed in the center of the disk substrate 620, which can be a similar configuration as shown in FIG. 1. The inner axicon 610 can be a reflective lens or a refractive lens. The outer reflective axicons 650 can be symmetrically configured in the disk substrate 620 and substantially centered by the inner axicon 610. In various embodiments, the inner axicon 610 configured in the disk substrate 620 and the outer reflective axicons 650 can form an all-reflective solution. When a plane wave 630 is introduced at normal incidence on the disk substrate 620, the inner axicon 610 can transform the plane wave into a radial symmetric wave with a constant angle of incidence onto a photoresist plane, and separate beam paths 635 can be provided from the outer reflective axicons 650 to apodize the incident beam intensity in radial direction. Interference patterns with circular symmetry can then be formed.

FIG. 7 depicts another exemplary illumination system 700 having two axicon geometries for symmetric illumination of circular interference fringes in accordance with the present teachings. The illumination system 700 can include an inner axicon 710, a disk substrate 720 and outer refractive axicons 760. The inner axicon 710 can be formed in the center of the disk substrate 720, which can be a similar configuration as shown in FIG. 1 and/or FIG. 6. The outer refractive axicons 760 can be symmetrically configured in the disk substrate 720 and substantially centered by the inner axicon 710. In various embodiments, the inner axicon 710 can be a reflective lens or a refractive lens. The outer refractive axicons 760 can be a circularly symmetric refractive axicon. When a plane wave 730 is introduced at normal incidence on the disk substrate 720, the inner axicon 710 can transform the plane wave into a radial symmetric wave with a constant angle of incidence onto a photoresist plane, and separate beam paths 735 can be provided from the outer refractive axicons 760 to apodize the incident beam intensity with radial position to form interference patterns with circular symmetry. In various embodiments, the illumination system 700 can include an optical source having a large transverse coherence, such as a $TEM_{00}$ single transverse mode laser, as opposed to, for example, an excimer laser with a low transverse coherence.

Figure 8:
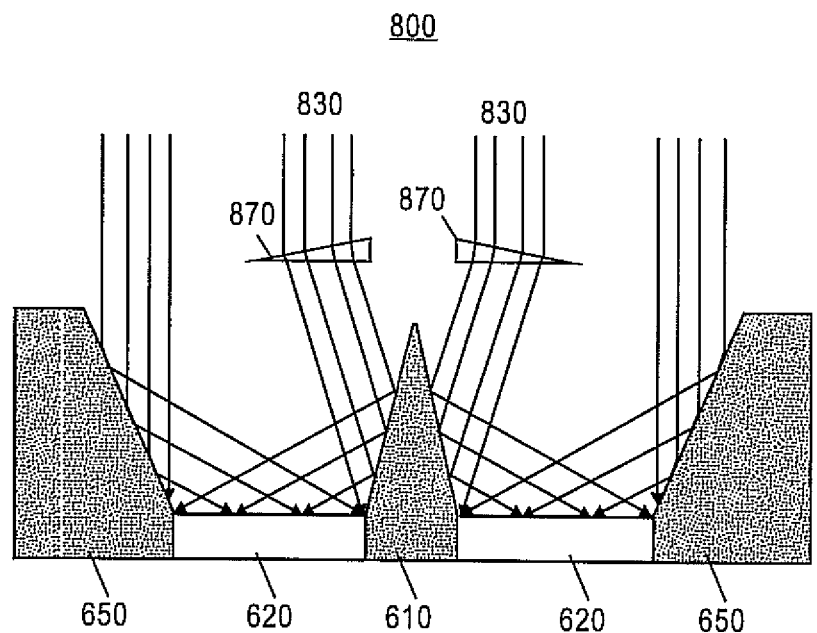
FIG. 8 depicts an exemplary illumination system having an axicon geometry for a coarser pitch in accordance with the present teachings.

In order to illuminate the entire disk area such as those shown in FIG. 1 and/or FIGS. 6-7, very steep angles can be used for the beam reflected from the central axicon 110, 610, and/or 710. A pitch near $\lambda/n$ for the optical system 100 of FIG. 1 and a pitch near $\lambda/2n$ for the optical systems 600 and 700 of FIGS. 6-7 can be obtained. In an exemplary embodiment, because the diameter of the central axicon (610/710) is restricted to, for example, about 0.5" by the constraints of the disk hub, it is not possible to decrease the opening ½ angle and increase the height of the axicons to provide a larger pitch while still illuminating the full disk area. FIG. 8 provides a solution to this issue by using two extra axicons in the central beam path based on the optical system shown in FIGS. 6-7.

FIG. 8 depicts an exemplary illumination system 800 having axicon geometry for a coarser pitch in accordance with the present teachings. Specifically, the system 800 can be configured by using an additional refractive axicon in the central beam of the optical systems 600 and/or 700 (see FIGS. 6-7) to allow propagation at angles closer to the normal to the disk. For example, the illumination system 800 can include one or more refractive axicons 870 in the central beam of the optical system 600 including an inner axicon 610, a disk substrate 620, and outer axicons 640 as shown in FIG. 6. In various embodiments, the outer axicons 640 can be reflective axicons or refractive axicons such as a circularly symmetric refractive axicon similar to that of the outer axicon 760 in FIG. 7.

The one or more refractive axicons 870 can be configured in the central plane wave 830 to convert the incident plane wave into a radially symmetric wave with the wavefronts directed towards the center of the disk substrate 620. The refractive axicon 870 can have a smaller ½ opening angle, where these wavefronts can be intercepted to produce a radially symmetric, outwardly directed wavefront at a polar angle θ closer to the normal. A radial interference pattern at a larger pitch ($\lambda/2n \sin\theta$) can be formed when the outer axicon 640 is also modified to provide a symmetric polar angle.

In various embodiments, the resulting pattern can be segmented, for example, along the perimeter of the circle and/or into concentric circles depending on specific applications. This segmentation can be different from a radial segmentation since there can be constant distances along the perimeter for each circular track.

Figure 9:
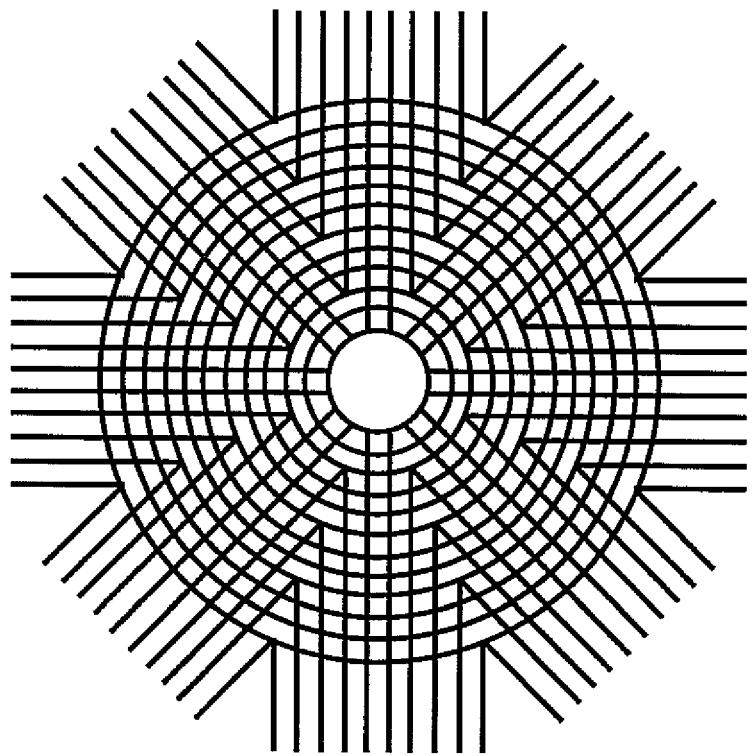
FIG. 9 depicts an approach to segmenting magnetic material along the perimeter of the concentric rings in accordance with the present teachings.

FIG. 9 depicts an approach to segmenting magnetic material along the perimeter of the concentric rings using a plurality of one-dimensional (1D) grating segments in accordance with the present teachings. The 1D grating pattern can be used to segment and keep the same distance for each track, and then to use multiple exposures with appropriately chosen areas and a rotated patterns to project this distance around the track. This can be extended with a larger number of exposures at different angles around the circle and more careful attention to matching of phases at the intersections of the various exposures.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An optical system comprising:
   a plane wave incident at normal incidence on a disk substrate, wherein an axicon optic is configured in a center of the disk substrate for transforming a first portion of the plane wave into a radial symmetric wave with a constant angle of incidence onto a photoresist plane, and producing a periodic spatially-varying intensity pattern with circular symmetry by interfering the radial symmetric wave with a second portion of the plane wave.

2. The system of claim 1, wherein the axicon optic is a reflective axicon or a refractive axicon.

3. The system of claim 1, wherein the axicon optic has an opening angle greater than about 45°.

4. The system of claim 1, wherein the constant angle of incidence is in azimuthal direction onto the photoresist plane.

5. The system of claim 1, wherein the plane wave is uniform and circularly polarized.

6. The system of claim 1, wherein the disk substrate has a diameter of about 2.5".

7. The system of claim 1, wherein the disk substrate has a hub with a diameter of about 0.5" or less.

8. The system of claim 1, further comprising two separate beam paths for the plane wave to apodize optical intensity in radial direction.

9. The system of claim 1 further comprising one or more axicons symmetrically configured in the disk substrate and substantially centered by the axicon optic.

10. The system of claim 9, wherein the periodic spatially-varying intensity pattern comprises a pitch determined by $\lambda/2n$, wherein $\lambda$ is optical source wavelength and n is refractive index of a medium in contact with the photoresist plane.

11. The system of claim 1, wherein the photoresist plane is disposed over a wafer substrate.

12. A device comprising the periodic spatially-varying intensity pattern with circular symmetry according to the system of claim 1, wherein the device is selected from the group consisting of CD ROMs, DVDs, and magnetic hard disk storage.

13. A method of forming an interference pattern comprising:
configuring an axicon optic in a center of a disk substrate;
introducing a plane wave incident at normal incidence on the axicon optic and the disk substrate; wherein the axicon optic transforms a first portion of the plane wave into a radial symmetric wave with a constant angle of incidence onto a photoresist plane; and
producing an periodic spatially-varying intensity pattern with circular symmetry on the photoresist plane by interfering the radial symmetric wave with a second portion of the plane wave.

14. The method of claim 13, wherein an opening angle ($\alpha$) of the axicon optic determines pattern period and lateral extent of the periodic spatially-varying intensity pattern.

15. An optical system comprising:
a plane wave incident at normal incidence on a disk;
a first axicon configured in a center of the disk to transform a first portion of the plane wave into a radial symmetric wave with a constant angle of incidence onto a photoresist layer; and
a plurality of second axicons symmetrically configured in the disk and substantially centered with the first axicon to provide a plurality of beam paths for apodizing optical intensity in the radial direction, and produce an interference pattern with periodic intensity variations in the photoresist layer, wherein the interference pattern has circular symmetry due to interference between the apodized radial symmetric wave and a second portion of the plane wave.

16. The system of claim 15, wherein the first axicon is a reflective axicon.

17. The system of claim 15, wherein each of the plurality of second axicons is a reflective axicon or a refractive axicon.

18. The system of claim 15, wherein the interference pattern has a pitch determined by $\lambda/2n$, wherein $\lambda$ is optical source wavelength and n is refractive index of a medium in contact with the photoresist layer.

19. The system of claim 15, further comprising a $TEM_{00}$ single transverse mode laser as an optical source.

20. The system of claim 15, further comprising one or more refractive axicons in a central plane wave to allow propagation at an angle closer to the normal to the disk.

21. The system of claim 19, wherein the interference pattern has a pitch determined by $\lambda/2n \sin\theta$, wherein $\lambda$ is optical source wavelength, n is refractive index of a medium in contact with the photoresist layer, and $\theta$ is a polar angle.

22. The system of claim 15, further comprising a plurality of one-dimensional grating segments to segment the interference pattern along the perimeter of a circle or into the circle.

* * * * *